US012796435B2

(12) United States Patent
He et al.

(10) Patent No.: US 12,796,435 B2
(45) Date of Patent: Nov. 10, 2026

(54) INTEGRATED CIRCUIT, MANUFACTURING METHOD, AND ELECTRONIC DEVICE

(71) Applicant: HUAWEI TECHNOLOGIES CO., LTD., Shenzhen (CN)

(72) Inventors: Ran He, Yokohama (JP); Shan Gao, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 838 days.

(21) Appl. No.: 18/050,030

(22) Filed: Oct. 26, 2022

(65) Prior Publication Data

US 2023/0070633 A1 Mar. 9, 2023

Related U.S. Application Data

(63) Continuation of application No. PCT/CN2020/087604, filed on Apr. 28, 2020.

(51) Int. Cl.
*H10W 20/42* (2026.01)
*H10W 20/00* (2026.01)
*H10W 20/47* (2026.01)

(52) U.S. Cl.
CPC ......... *H10W 20/42* (2026.01); *H10W 20/056* (2026.01); *H10W 20/081* (2026.01); *H10W 20/47* (2026.01)

(58) Field of Classification Search
CPC ............... H01L 23/5226; H01L 23/481; H01L 21/76802; H01L 21/76877; H01L 23/53295; H01L 23/564; H01L 21/76898; H10W 20/42; H10W 20/056; H10W 20/081; H10W 20/47; H10W 20/0242; H10W 20/0245; H10W 20/0265; H10W 20/20; H10W 20/2134; H10W 20/48; H10W 20/023
See application file for complete search history.

(56) References Cited

U.S. PATENT DOCUMENTS

2009/0315154 A1* 12/2009 Kirby ..................... H10D 30/60 257/E21.627
2011/0193226 A1* 8/2011 Kirby ................ H01L 21/76805 257/E21.585
2013/0249045 A1* 9/2013 Kang .................... H01L 23/562 257/499
2015/0137388 A1* 5/2015 Kim ...................... H01L 23/481 257/774
2015/0235922 A1* 8/2015 Chen ................ H01L 21/76898 257/383
2015/0287680 A1* 10/2015 Jin ...................... H01L 23/5329 257/751

(Continued)

*Primary Examiner* — Bac H Au

(57) ABSTRACT

An integrated circuit includes: a silicon substrate, and a redistribution layer located on the silicon substrate, where the redistribution layer includes metal routing and a dielectric layer of a first material. An isolation area that runs through the redistribution layer is disposed in the redistribution layer. The isolation area includes a second material. A porosity of the second material is less than a porosity of the first material. A via is disposed inside the isolation area, and the second material surrounds a part of the via. The second material may be a dense material, such that water vapor in the via can be effectively isolated.

19 Claims, 9 Drawing Sheets

(56) References Cited

U.S. PATENT DOCUMENTS

| | | | | |
|---|---|---|---|---|
| 2015/0348874 | A1* | 12/2015 | Tsai | H01L 21/76898 257/774 |
| 2017/0200675 | A1* | 7/2017 | Jung | H01L 23/53295 |
| 2017/0229367 | A1* | 8/2017 | Ge | H10D 86/01 |
| 2019/0115258 | A1* | 4/2019 | Tsai | H01L 21/76831 |
| 2020/0058617 | A1* | 2/2020 | Wu | H01L 24/80 |
| 2020/0075458 | A1* | 3/2020 | Lee | H01L 23/5226 |
| 2020/0152608 | A1* | 5/2020 | Hu | H01L 24/20 |
| 2020/0258778 | A1* | 8/2020 | Lilak | H01L 21/76895 |
| 2020/0388567 | A1* | 12/2020 | Mignot | H01L 21/76877 |
| 2023/0005847 | A1* | 1/2023 | Chang | H01L 21/76802 |
| 2023/0116911 | A1* | 4/2023 | Lee | H01L 21/76895 257/621 |

* cited by examiner (a)

(b)

INTEGRATED CIRCUIT, MANUFACTURING METHOD, AND ELECTRONIC DEVICE

CROSS-REFERENCE TO RELATED APPLICATIONS

This application is a continuation of International Application No. PCT/CN2020/087604, filed on Apr. 28, 2020, the disclosure of which is hereby incorporated by reference in its entirety.

TECHNICAL FIELD

This application relates to the field of electronic technologies, and in particular, to an integrated circuit, a manufacturing method, and an electronic device.

BACKGROUND

A through silicon via (TSV) technology is a high-intensity packaging technology, can implement vertical electrical interconnection of through silicon vias by filling a conductive material, for example, copper, tungsten, or polycrystalline silicon, and has advantages of shortening a path, reducing a package size, and improving an integration level of an integrated circuit, so that this technology may be applied to integrated circuits. Currently, in an integrated circuit, a dielectric material with a low dielectric constant is usually used to reduce same-layer capacitance in metal interconnection, to improve an operating speed of the integrated circuit. In a method for forming the dielectric material with a low dielectric constant, micropores are usually introduced into a dielectric material to form a porous structure, and an equivalent dielectric constant of the dielectric material is reduced by using air in the micropores. However, the use of a low-dielectric-constant material with a micropore structure brings a great challenge to a process of a conventional through silicon via in an integrated circuit.

Currently, in a process of a through silicon via—middle (TSV-middle) and a through silicon via—last (TSV-last) in an integrated circuit, it is usually after a redistribution layer (RDL) of a dielectric material with a low dielectric constant is completed that a via that runs through the redistribution layer and a substrate is formed through photoetching and etching, and then filling and planarization of a metal are performed. After the dielectric material is etched, wet cleaning needs to be performed on the dielectric material, and an organic solvent, inorganic liquid, or the like is used as a cleanser to remove residue during an etching process. These cleansers each have water molecules, and the water molecules easily permeate into the redistribution layer through micropores of the dielectric material with a low dielectric constant, thereby causing a series of problems such as a dielectric constant increase of the dielectric material with a low dielectric constant, degradation of a time dependent dielectric breakdown (TDDB) characteristic, oxidation of metal routing, degradation of electromigration resistance, and delamination.

In the conventional technology, as shown in FIG. 1, a metal water vapor isolation ring close to the TSV is usually manufactured around a TSV based on processing of metal routing in an RDL, so that the metal routing that is in the RDL and that is close to the TSV is sealed with the metal water vapor isolation ring, to prevent water molecules from permeating into the redistribution layer. However, the metal water vapor isolation ring needs to keep a distance from the TSV and the metal routing. Therefore, an area of the integrated circuit may be increased. In addition, the water molecules still corrode the metal routing that is in the redistribution layer and that is close to the TSV. Therefore, an effect of the conventional technology is not good.

SUMMARY

This application provides an integrated circuit, a manufacturing method, and an electronic device, to prevent water vapor from permeating into a redistribution layer, thereby resolving problems of an increase of a dielectric constant of a dielectric, oxidation of metal routing, and the like caused by permeation of water vapor.

To achieve the foregoing objective, the following technical solutions are used in this application.

According to a first aspect, an integrated circuit is provided. The integrated circuit includes: a silicon substrate, where the silicon substrate usually may be a manufactured wafer or a die; and a redistribution layer located on the silicon substrate, where the redistribution layer includes metal routing and a dielectric layer. The metal routing may be metal routing in the dielectric layer. The dielectric layer is a first material, and the first material may be a porous material. An isolation area that runs through the redistribution layer is disposed in the redistribution layer. The isolation area includes a second material. A porosity of the second material is less than a porosity of the first material, for example, the second material may be a dense material. A via is disposed inside the isolation area and the second material surrounds a part of the via. The porosity is usually a ratio of a volume of pores in a material to a total volume of the material. Therefore, the porosity of the first material may be a ratio of a volume of pores in the first material to a total volume of the first material, and the porosity of the second material may be a ratio of a volume of pores in the second material to a total volume of the second material.

In the integrated circuit provided in the foregoing technical solution, the isolation area with the second material is disposed in the redistribution layer, the via is disposed inside the isolation area, and the second material surrounds the via. Because the porosity of the second material is less than the porosity of the first material, when the second material in the isolation area surrounds the via, less water vapor in the via may permeate into the dielectric layer and the metal routing. Therefore, a series of problems caused by the water vapor permeating into the dielectric layer are resolved, such as a dielectric constant increase, degradation of a time dependent dielectric breakdown (TDDB) characteristic, oxidation of the metal routing, degradation of electromigration resistance, and delamination.

In a possible implementation of the first aspect, the first material is a porous material, for example, the first material includes a large quantity of micropores or voids. The second material is a dense material, for example, the second material may be a solid material, that is, there may be no micropores or voids in the second material. In the foregoing possible implementation, a dielectric constant of the porous material is usually low, so that when the dielectric layer is a porous material, a transmission speed of an electrical signal in the integrated circuit may be improved. In addition, because the porous material can easily absorb water and the dense material can isolate water vapor, the dense material may surround the via in the isolation area, so that the water vapor in the via cannot permeate into the dielectric layer and the metal routing through the second material. Therefore, a series of problems caused by the water vapor permeating into the dielectric layer are resolved.

In a possible implementation of the first aspect, the porosity of the first material is greater than or equal to a first preset value, and the porosity of the second material is less than the first preset value. Optionally, the first preset value is 5%. In the foregoing possible implementation, because a higher porosity indicates a smaller dielectric constant, when the first preset value is 5%, the first material may be one of a majority of materials with a low dielectric constant, and the materials with a low dielectric constant may improve the transmission speed of the electrical signal in the integrated circuit.

In a possible implementation of the first aspect, a dielectric constant of the first material is less than a dielectric constant of silicon dioxide $SiO_2$. In the foregoing possible implementation, the dielectric constant of the first material is small. When the first material in the dielectric layer is a material with a small dielectric constant, the transmission speed of the electrical signal in the integrated circuit may be improved.

In a possible implementation of the first aspect, the first material includes at least one of the following: porous carbon-doped silicon oxide, porous methyl silsesquioxane, porous hydrogen silsesquioxane, and porous organosilicate glass. In the foregoing possible implementation, flexibility and diversity of the first material in the dielectric layer can be improved.

In a possible implementation of the first aspect, the second material includes at least one of the following: silicon oxide SiO, silicon nitride SiN, silicon carbide SiC, silicon oxycarbide SiOC, silicon carbonitride SiCN, silicon oxynitride SiON, and silicon carbonitride oxide SiCNO. In the foregoing possible implementation, flexibility and diversity of the second material in the isolation area can be improved.

In a possible implementation of the first aspect, the redistribution layer includes a first redistribution layer and a second redistribution layer. The first redistribution layer is located between the silicon substrate and the second redistribution layer. A dielectric barrier layer is separately disposed between the first redistribution layer and the second redistribution layer, and on a side that is on the second redistribution layer and that is away from the first redistribution layer. In the foregoing possible implementation, when the redistribution layer includes a plurality of layers, an isolation area may be disposed in each layer of the redistribution layer, and the second material in the isolation area surrounds the via, thereby preventing the water vapor from permeating into each layer of the redistribution layer, and then resolving a series of problems caused by the water vapor permeating into the dielectric layer.

In a possible implementation of the first aspect, the metal routing in the redistribution layer is electrically connected to a metal material disposed in the via on an outer side of the dielectric layer. For example, the integrated circuit further includes an electrical connection layer, and the electrical connection layer is located on a side that is on the redistribution layer and that is away from the silicon substrate. The metal routing in the redistribution layer is electrically connected to the metal material disposed in the via in the electrical connection layer. A material in the electrical connection layer may be the second material.

In a possible implementation of the first aspect, the via runs through the isolation area and extends to the silicon substrate along a depth direction of the redistribution layer, and the second material in the isolation area surrounds a part that is of the via and that runs through the isolation area.

In a possible implementation of the first aspect, the isolation area is cylindrical. The second material in the isolation area is in contact with the via, or the first material is disposed between the second material and the via in the isolation area. In the foregoing possible implementation, flexibility and diversity of the isolation area disposed in the dielectric layer can be improved.

According to a second aspect, a manufacturing method of an integrated circuit is provided. The method includes: forming a redistribution layer on a silicon substrate, and forming an isolation area that runs through the redistribution layer in the redistribution layer. The silicon substrate usually may be a manufactured wafer or a die. The redistribution layer includes metal routing and a dielectric layer. The metal routing may be metal routing in the dielectric layer, the dielectric layer is a first material, and the first material may be a porous material. The isolation area includes a second material. A porosity of the second material is less than a porosity of the first material, for example, the second material may be a dense material. The porosity is usually a ratio of a volume of pores in a material to a total volume of the material. Therefore, the porosity of the first material may be a ratio of a volume of pores in the first material to a total volume of the first material, and the porosity of the second material may be a ratio of a volume of pores in the second material to a total volume of the second material. The method further includes: forming a via in the isolation area, where the second material in the isolation area surrounds at least a part of the via.

In the foregoing technical solution, the isolation area with the second material is formed in the dielectric layer of the redistribution layer, the via is formed inside the isolation area, and the second material surrounds the via. Because the porosity of the second material is less than the porosity of the first material, when the second material in the isolation area surrounds the via, less water vapor in the via may permeate into the dielectric layer and the metal routing. Therefore, a series of problems caused by the water vapor permeating into the dielectric layer are resolved, such as a dielectric constant increase, degradation of a time dependent dielectric breakdown characteristic, oxidation of the metal routing, degradation of electromigration resistance, and delamination.

In a possible implementation of the second aspect, the redistribution layer includes a first redistribution layer and a second redistribution layer. The first redistribution layer includes first metal routing and a first dielectric layer, and the second redistribution layer includes second metal routing and a second dielectric layer. The isolation area includes a first isolation area and a second isolation area. The forming a redistribution layer on a silicon substrate, and forming an isolation area that runs through the redistribution layer in the redistribution layer includes: forming the first dielectric layer on the silicon substrate; forming the first isolation area that runs through the first dielectric layer in the first dielectric layer; forming the first metal routing in the first dielectric layer, for example, forming a groove that is used for the metal routing in the first dielectric layer, filling the groove with a metal material, and then performing planarization to obtain the first redistribution layer; forming the second dielectric layer on the first redistribution layer; forming the second isolation area that runs through the second dielectric layer in the second dielectric layer; and forming the second metal routing in the second dielectric layer, for example, forming a groove that is used for the metal routing in the second dielectric layer, filling the groove with a metal material, and then performing planarization to obtain the second redistribution layer. In the foregoing possible implementation, when the redistribution layer includes a plurality of layers, an isolation area may be formed in each layer of the redistribution layer, and the second material in the isolation area surrounds a part of the via. Because the porosity of the second material is less than the porosity of the first material, when the second material in the isolation area of each layer of the redistribution layer surrounds the via, less water vapor in the via may permeate into the dielectric layer and the metal routing, and then a series of problems caused by the water vapor permeating into the dielectric layer.

In a possible implementation of the second aspect, the forming the first isolation area that runs through the first dielectric layer in the first dielectric layer includes: depositing a first hard mask on the first dielectric layer, and forming a first groove that runs through the first dielectric layer in the first dielectric layer, where the first hard mask is removed during subsequent formation of the first metal routing; and filling the first groove with the second material, to form the first isolation area that runs through the first dielectric layer. The forming the second isolation area that runs through the second dielectric layer in the second dielectric layer includes: depositing a second hard mask on the second dielectric layer, and forming a second groove that runs through the second dielectric layer in the second dielectric layer, where projections that are of the first groove and the second groove and that are in a same dielectric layer overlap, and the second hard mask is removed during subsequent formation of the second metal routing; and filling the second groove with the second material to form the second isolation area that runs through the second dielectric layer. In the foregoing possible implementation, a simple and effective manner of forming an isolation area running through a dielectric layer in the dielectric layer is provided.

In a possible implementation of the second aspect, before the forming the second dielectric layer on the first redistribution layer, the method further includes: forming a first dielectric barrier layer on the first redistribution layer. After the forming the second metal routing in the second dielectric layer, to obtain the second redistribution layer, the method further includes: forming a second dielectric barrier layer on the second redistribution layer. In the foregoing possible implementation, the dielectric barrier layers may prevent dielectric diffusion between the redistribution layers on both sides of a dielectric isolation layer and between an external environment and a redistribution layer.

In a possible implementation of the second aspect, the forming a via in the isolation area includes: forming the via in the isolation area in a direction from a side that is on the redistribution layer and that is away from the silicon substrate to the silicon substrate; or forming the via in the isolation area in a direction from a side that is on the silicon substrate and that is away from the redistribution layer to the redistribution layer. In the foregoing possible implementation, flexibility of forming the via in the isolation area can be improved.

In a possible implementation of the second aspect, the first material is a porous material, for example, the first material includes a large quantity of micropores or voids. The second material is a dense material, for example, the second material may be a solid material, that is, there may be no micropores or voids in the second material. In the foregoing possible implementation, a dielectric constant of the porous material is usually low, so that when the dielectric layer is a porous material, a transmission speed of an electrical signal in the integrated circuit may be improved. In addition, because the porous material can easily absorb water and the dense material can isolate water vapor, the dense material may surround the via in the isolation area, so that the water vapor in the via cannot permeate into the dielectric layer and the metal routing through the second material. Therefore, a series of problems caused by the water vapor permeating into the dielectric layer are resolved.

In a possible implementation of the second aspect, the porosity of the first material is greater than or equal to a first preset value, and the porosity of the second material is less than the first preset value. Optionally, the first preset value is 5%. In the foregoing possible implementation, because a higher porosity indicates a smaller dielectric constant, when the first preset value is 5%, the first material may be one of a majority of materials with a low dielectric constant, and the materials with a low dielectric constant may improve the transmission speed of the electrical signal in the integrated circuit.

In a possible implementation of the second aspect, a dielectric constant of the first material is less than a dielectric constant of silicon dioxide SiO2. In the foregoing possible implementation, the dielectric constant of the first material is small. When the first material in the dielectric layer is a material with a small dielectric constant, the transmission speed of the electrical signal in the integrated circuit may be improved.

In a possible implementation of the second aspect, the first material includes at least one of the following: porous carbon-doped silicon oxide, porous methyl silsesquioxane, porous hydrogen silsesquioxane, and porous organosilicate glass. In the foregoing possible implementation, flexibility and diversity of the first material in the dielectric layer can be improved.

In a possible implementation of the second aspect, the second material includes at least one of the following: silicon oxide SiO, silicon nitride SiN, silicon carbide SiC, silicon oxycarbide SiOC, silicon carbonitride SiCN, silicon oxynitride SiON, and silicon carbonitride oxide SiCNO. In the foregoing possible implementation, flexibility and diversity of the second material in the isolation area can be improved.

In a possible implementation of the second aspect, the method further includes: electrically connecting the metal routing in the redistribution layer to a metal material disposed in the via on an outer side of the dielectric layer. For example, an electrical connection layer is formed on a side that is on the redistribution layer and that is away from the silicon substrate, and the metal routing in the redistribution layer is electrically connected to the metal material disposed in the via in the electrical connection layer.

In a possible implementation of the second aspect, the via runs through the isolation area and extends to the silicon substrate along a depth direction of the redistribution layer, and the second material in the isolation area surrounds a part that is of the via and that runs through the isolation area.

In a possible implementation of the second aspect, the isolation area is cylindrical. The second material in the isolation area is in contact with the via, or the first material is disposed between the second material and the via in the isolation area. In the foregoing possible implementation, flexibility and diversity of the isolation area disposed in the dielectric layer can be improved.

According to a third aspect, an electronic device is provided. The electronic device includes: a printed circuit board, and the integrated circuit provided in the first aspect or any possible implementation of the first aspect. The integrated circuit is fixed on the printed circuit board.

Optionally, the integrated circuit may be an integrated circuit corresponding to a processor or memory of the electronic device.

In a possible implementation of the third aspect, the electronic device is a terminal device or a base station.

According to another aspect of this application, a non-transitory computer-readable storage medium used together with a computer is provided. The computer has software for creating an integrated circuit. The computer-readable storage medium stores one or more computer-readable data structures, and the one or more computer-readable data structures have photomask data for manufacturing the integrated circuit provided in the first aspect or any possible implementation of the first aspect.

It may be understood that the manufacturing method of any integrated circuit, the electronic device, the non-transitory computer-readable storage medium used together with the computer, and the like that are provided above each include a same or corresponding feature of the integrated circuit provided above. Therefore, for beneficial effects that can be achieved, refer to the beneficial effects in the corresponding integrated circuit provided above. Details are not described herein again.

DESCRIPTION OF EMBODIMENTS

Figure 1:
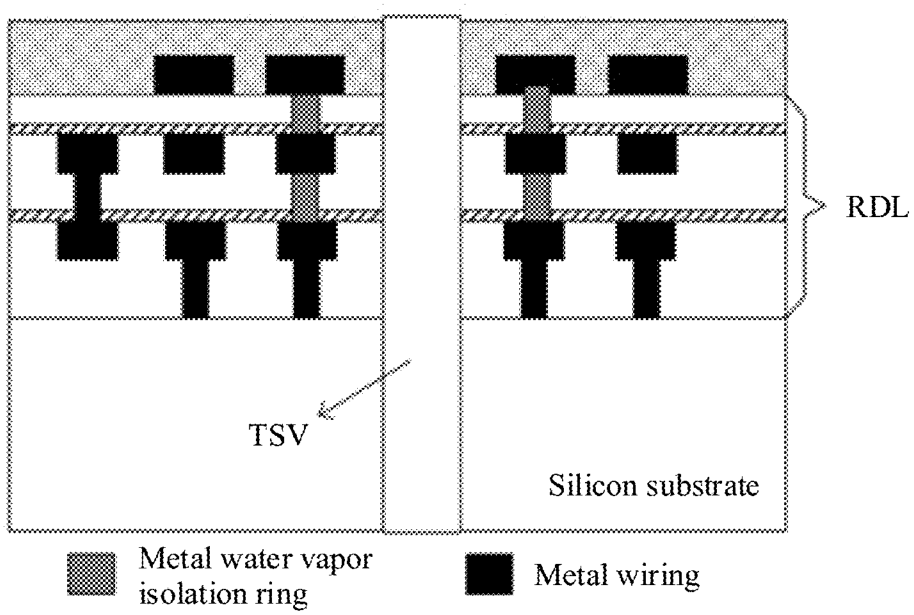
FIG. 1 is a schematic diagram of a structure of an integrated circuit.

The following describes in detail manufacturing and use in each embodiment. However, it should be understood that a plurality of applicable inventive concepts provided in this application may be implemented in a plurality of specific environments. The specific embodiments discussed only describe specific manners for implementing and using the present specification and the present technology, without limiting the scope of this application.

Unless otherwise defined, all scientific and technological terms used herein have same meanings as those known by a person of ordinary skill in the art.

Each circuit or another component may be described as or referred to as “configured to” perform one or more tasks. In this case, “configured to” is used to imply a structure by indicating that the circuit/component includes a structure (for example, a circuit system) that performs one or more tasks during an operation. Therefore, even when a specified circuit/component is currently inoperable (for example, not opened), the circuit/component may be referred to as being configured to perform the task. Circuits/components used in conjunction with “configured to” include hardware, such as a circuit that performs an operation.

The following describes technical solutions in embodiments of this application with reference to the accompanying drawings in embodiments of this application. In this application, “at least one” means one or more, and “a plurality of” means two or more. “And/or” describes an association relationship between associated objects, and represents that three relationships may exist. For example, A and/or B may represent the following cases: Only A exists, both A and B exist, and only B exists, where A and B may be singular or plural. The character “/” usually indicates an “or” relationship between associated objects. “At least one of the following items (pieces)” or a similar expression thereof refers to any combination of these items, including any combination of singular items (pieces) or plural items (pieces). For example, at least one item (piece) of a, b, or c may represent a, b, c, a and b, a and c, b and c or a, and b and c, where a, b, and c may be singular or plural. In addition, in embodiments of this application, words such as “first” and “second” do not limit a quantity and a sequence.

It should be noted that, in embodiments of this application, the term such as “example” or “for example” is used to represent giving an example, an illustration, or descriptions. Any embodiment or design scheme described as an “example” or “for example” in embodiments of this application should not be explained as being more preferred or having more advantages than another embodiment or design scheme. Exactly, use of the word “example”, “for example”, or the like is intended to present a related concept in a specific manner.

Technical solutions of this application may be applied to various processors or memories that use a through silicon via (TSV) technology. For example, the technical solutions of this application may be applied to a field-programmable gate array (FPGA), an image sensor, a dynamic random access memory (DRAM), and the like. Further, the technical solutions of this application may be further applied to a processor or a memory that is produced based on a 2.5 D or 3D stack process, for example, applied to a 2.5 D stack FPGA, a 3D stack image sensor, or a 3D stack DRAM. In addition, the technical solutions in this application may be further applied to a new processor or memory, and details are not enumerated in the embodiments of this application one by one.

Figure 2:
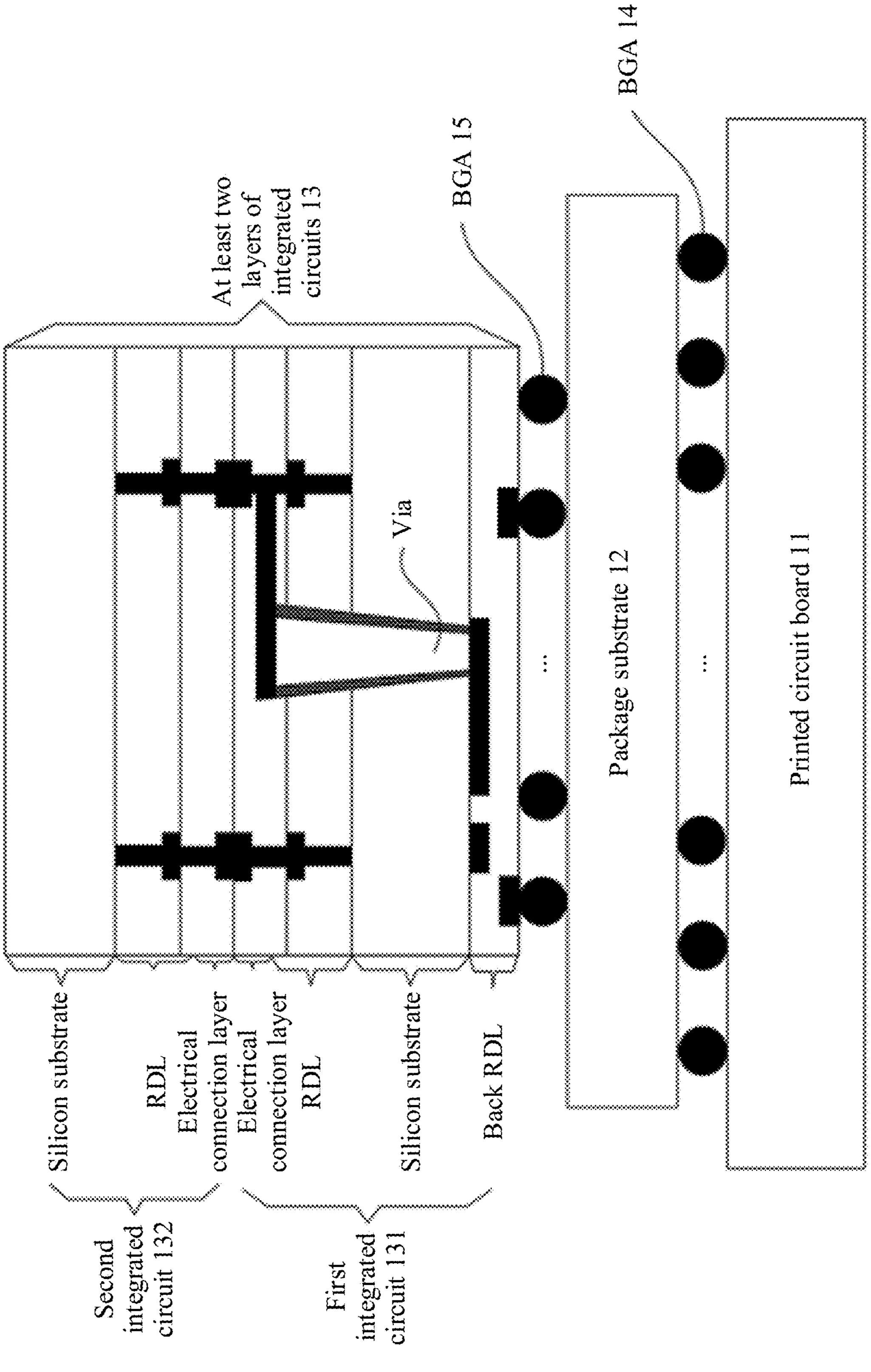
FIG. 2 is a schematic diagram of a structure of an integrated circuit using a TSV technology and a stacking technology according to an embodiment of this application.

FIG. 2 is a schematic diagram of a structure of an integrated circuit of a processor or a memory using a through silicon via technology and a stacking technology according to an embodiment of this application. The integrated circuit may include a printed circuit board (PCB) 11, a package substrate 12, and at least two layers of integrated circuits 13 that are stacked. In FIG. 2, an example in which the at least two layers of integrated circuits include a first integrated circuit 131 and a second integrated circuit 132 stacked on the first integrated circuit 131 is used for description.

A ball grid array (BGA) 14 is disposed on a side that is on the package substrate 12 and that is close to the PCB 11, and the package substrate 12 may be fastened to the PCB 11 by using the BGA 14. A BGA 15 is disposed on a side that is on the first integrated circuit 131 and that is close to the package substrate 12, and the first integrated circuit 131 may be fastened to the package substrate 12 by using the BGA 15.

In addition, the first integrated circuit 131 and the second integrated circuit 132 each may include a silicon substrate, a redistribution layer (RDL), and an electrical connection layer. The RDL is located between the silicon substrate and the electrical connection layer, and the electrical connection layer of the first integrated circuit 131 is in contact with the electrical connection layer of the second integrated circuit 132, to implement metal interconnection between the first integrated circuit 131 and the second integrated circuit 132. For example, the silicon substrate in the first integrated circuit 131 is close to the package substrate 12, and the electrical connection layer in the first integrated circuit 131 is away from the package substrate 12. The silicon substrate in the second integrated circuit 132 is away from the package substrate 12, and the electrical connection layer in the second integrated circuit 132 is close to the package substrate 12.

A via is disposed in the first integrated circuit 131, and the via at least runs through the RDL of the first integrated circuit 131. The via may be filled with a metal material, and the metal material and metal routing in the RDL of the first integrated circuit 131 may be electrically connected in the electrical connection layer of the first integrated circuit 131. Optionally, a back RDL may be disposed on a side that is of the first integrated circuit 131 and that is close to the package substrate, and the back RDL may be configured to implement an electrical connection between the silicon substrate and the BGA 15 in the first integrated circuit 131.

Figure 3:
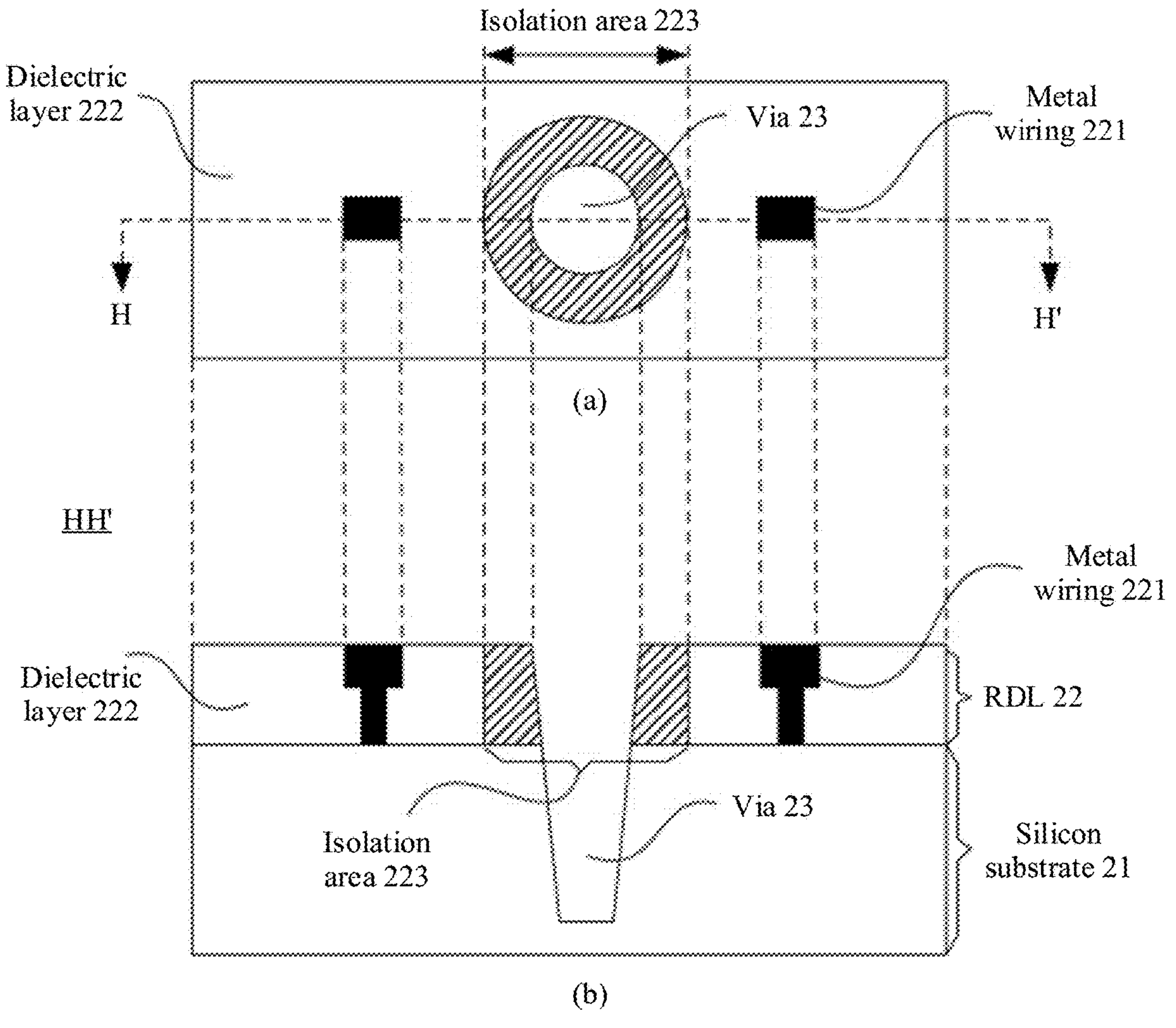
FIG. 3 is a schematic diagram of a structure of a first integrated circuit according to an embodiment of this application.

FIG. 3 is a schematic diagram of a structure of an integrated circuit according to an embodiment of this application. (a) in FIG. 3 is a top view of the integrated circuit. (b) in FIG. 3 is a sectional view obtained by viewing downward in a direction perpendicular to a straight line HH' shown in (a) in FIG. 3. With reference to FIG. 3, the integrated circuit includes: a silicon substrate 21, where the silicon substrate 21 may usually refer to a manufactured wafer or a die; a redistribution layer (RDL) 22 located on the silicon substrate 21, where the RDL 22 includes metal routing 221 and a dielectric layer 222, and the dielectric layer 222 is a first material whose porosity is greater than or equal to a first preset value. An isolation area 223 that runs through the RDL 22 is disposed in the RDL 22. For example, the isolation area 223 may be located in a central area of the RDL 22 and may have a same height as the RDL 22. The isolation area 223 may be cylindrical, and a cross section of the cylindrical area may be circular, oval, polygonal, or the like. In addition, the isolation area 223 includes a second material whose porosity is less than the porosity of the first material, a via 23 is disposed in the isolation area 223, and the second material surrounds at least a part of the via 23. The porosity is usually a ratio of a volume of pores in a material to a total volume of the material. Therefore, the porosity of the first material may be a ratio of a volume of pores in the first material to a total volume of the first material, and the porosity of the second material may be a ratio of a volume of pores in the second material to a total volume of the second material.

In an embodiment, the porosity of the first material is greater than or equal to the first preset value, and the porosity of the second material is less than the first preset value. The first preset value may be set in advance. For example, the first preset value may be 5%, 6%, or the like. A specific value of the first preset value may be determined by a person skilled in the art based on experience, or obtained by performing a test based on an actual situation. This is not specifically limited in this embodiment of this application.

In an embodiment, a material whose porosity is greater than or equal to the first preset value may be referred to as the first material, and a material whose porosity is less than the first preset value may be referred to as the second material. For example, a material whose porosity is greater than or equal to 5% may be referred to as the first material, and a material whose porosity is less than 5% may be referred to as the second material. The first material may also be referred to as a porous material, to be specific, the first material may include a large quantity of micropores or voids, and has characteristics of easy water absorption and low dielectric constant. For example, the porosity of the first material is 5% to 75%, and the dielectric constant of the first material is less than the dielectric constant of silicon dioxide (chemical formula: $SiO_2$). The dielectric constant of $SiO_2$ is 4, and the dielectric constant of the first material may be 2.5 to 3.2. The second material may also be referred to as a dense material. For example, the second material may be a solid material, to be specific, there may be no micropores or voids in the second material, and the second material has a characteristic of being not easy to absorb water. Usually, a dielectric constant of the second material is greater than the dielectric constant of the first material. For example, the dielectric constant of the second material may be greater than 3.2.

Optionally, the first material includes at least one of the following: porous carbon-doped silicon oxide (CDO), porous methyl silsesquioxane (MSQ), porous hydrogen silsesquioxane (HSQ), or porous organosilicate glass (OSG). A chemical formula of carbon-doped silicon oxide is SiOC. For example, the first material may only include the porous CDO, the porous MSQ, the porous HSQ, or the porous OSG. Alternatively, the first material simultaneously includes any two, three, or four materials of the porous CDO, the porous MSQ, the porous HSQ, and the porous OSG. It should be noted that the first material may further include another porous material. The porous silicon oxycarbide, the methyl silsesquioxane, and the hydrogen silsesquioxane herein are merely examples, and are not construed as a limitation on this embodiment of this application.

Alternatively, the first material in the dielectric layer 222 may be replaced with another non-porous material that has characteristics of easy water absorption and low dielectric constant. For example, the another non-porous material may include fluorosilicate glass (FSG), where a dielectric constant of the FSG is 3.8. Because there is a Si—F bond (that is, $Si\text{-}F+H_2O \rightarrow Si\text{—}OH+HF$, where HF is a chemical formula of hydrogen fluoride) that easily reacts with water (chemical formula: $H_2O$) in the FSG, the dielectric constant of the FSG is increased after the reaction.

Optionally, the second material includes at least one of the following: silicon oxide (chemical formula: SiO), silicon nitride (chemical, SiN), silicon carbide (chemical formula: SiC), silicon oxycarbide (chemical formula: SiOC), silicon carbonitride (chemical formula: SiCN), silicon oxynitride (chemical formula: SiON), and silicon carbonitride oxide (chemical formula: SiCNO). For example, the second material may only include SiO, SiN, SiOC, SiCN, SiON, or SiCNO, or the second material may simultaneously include any two or more of SiO, SiN, SiOC, SiCN, SiON, and SiCNO. It should be noted that the second material may further include another dense material. SiO, SiN, SiOC, SiCN, SiON, and SiCNO herein are merely examples, and are not construed as a limitation on this embodiment of this application.

Figure 4:
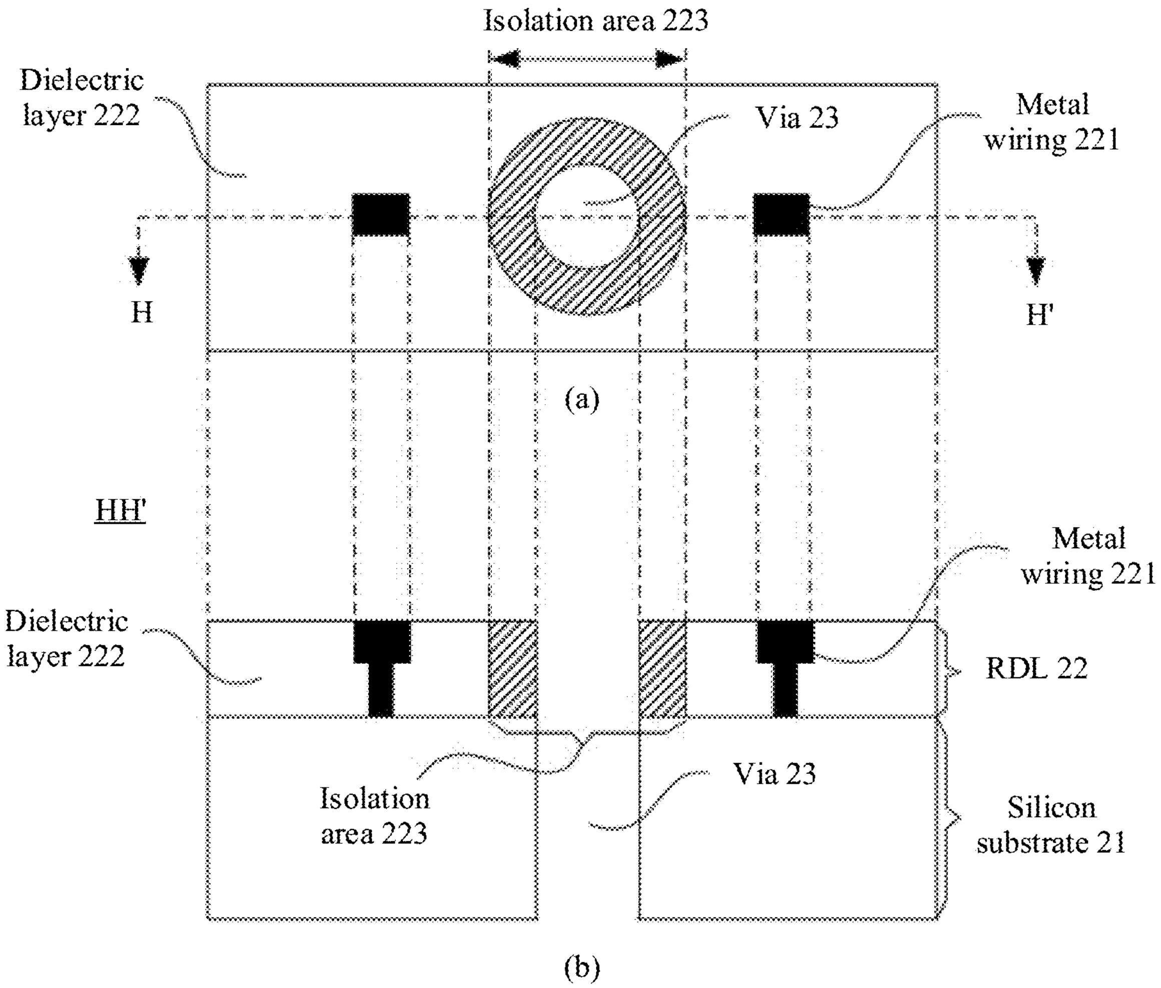
FIG. 4 is a schematic diagram of a structure of a second integrated circuit according to an embodiment of this application.

In addition, the via 23 may be a through silicon via (TSV). The via 23 may run through the isolation area 223 and extend to the silicon substrate 21 in a depth direction of the RDL 22, and the second material in the isolation area 223 surrounds a part that is of the via 23 and that runs through the isolation area 223. Optionally, a part that is of the via 23 and that extends to the silicon substrate 21 may run through the silicon substrate 21, or may not run through the silicon substrate 21. For example, as shown in (b) in FIG. 3, the part that is of the via 23 and that extends to the silicon substrate 21 does not run through the silicon substrate 21. As shown in (b) in FIG. 4, the part that is of the via 23 and that extends to the silicon substrate 21 runs through the silicon substrate 21. (a) in FIG. 4 is a top view of the integrated circuit, and (b) in FIG. 4 is a sectional view of the integrated circuit shown in (a) in FIG. 4 by viewing downward in a direction perpendicular to a straight line HH'. In addition, the via 23 may be a via with an equal diameter, or may be a via with unequal diameters. For example, the via 23 may be the via shown in (b) in FIG. 3, or may be the via shown in (b) in FIG. 4. This is not specifically limited in this embodiment of this application.

Optionally, the isolation area 223 is cylindrical. The second material in the isolation area 223 is in contact with the via 23, or the first material is disposed between the second material and the via 23 in the isolation area 223. It should be noted that the cylindrical isolation area herein may not be limited to a cylindrical structure whose cross section is circular, and further includes a cylindrical structure whose cross section is oval, triangular, quadrilateral, pentagonal, hexagonal, or of another shape.

Figure 5:
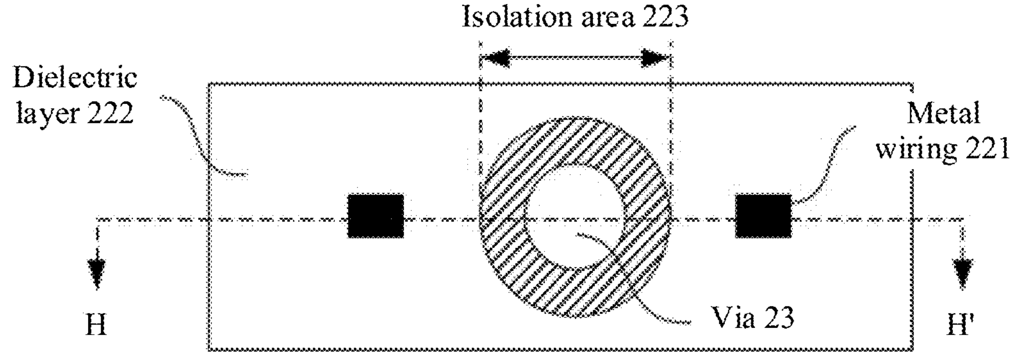
FIG. 5 is a schematic diagram of a structure of a third integrated circuit according to an embodiment of this application.
Figure 5:
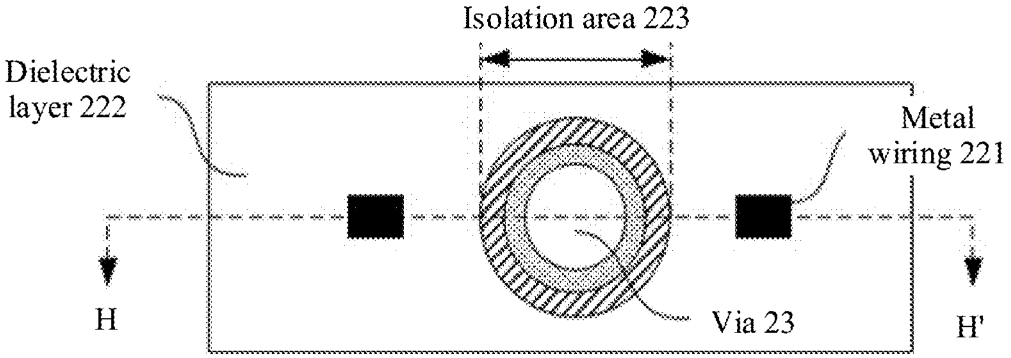

For example, FIG. 5 is a top view of an isolation area 223 provided in this embodiment of this application. (a) in FIG. 5 is a schematic diagram of an isolation area 223 in which the second material is in contact with the via 23. (b) in FIG. 5 is a schematic diagram of an isolation area 223 in which the first material is disposed between the second material and the via 23. In FIG. 5, only a cylindrical isolation area with a ring-shaped cross section is used as an example for description.

Further, the RDL 22 may include one or more layers. For example, the RDL 22 shown in FIG. 6 includes two layers. When the RDL 22 includes one layer, a dielectric barrier layer 24 may be disposed on a side that is of an RDL of this layer and that is away from the silicon substrate 21. When the RDL 22 includes a plurality of layers, a dielectric barrier layer 24 may be disposed between any two adjacent layers of RDLs in the plurality of layers of RDLs, and disposed on a side that is of a top layer RDL in the plurality of layers of RDLs and that is away from the silicon substrate 21. The top layer RDL herein may be a layer of RDL that is farthest from the silicon substrate 21. The dielectric barrier layer 24 may include any one of the following materials: SiCN, SiCNO, SiON, or the like. This is not specifically limited in this embodiment of this application. The disposed dielectric barrier layer 24 may be configured to block dielectric diffusion between adjacent two layers of RDLs and between an external environment and the RDL 22.

Figure 6:
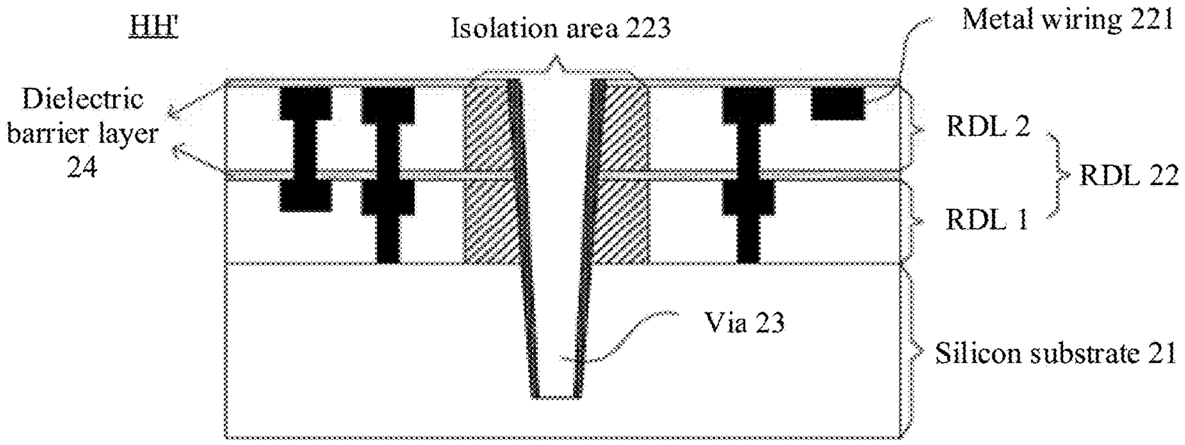
FIG. 6 is a schematic diagram of a structure of a fourth integrated circuit according to an embodiment of this application.

For example, as shown in FIG. 6, the RDL 22 includes a first redistribution layer RDL 1 and a second redistribution layer RDL 2. The first redistribution layer RDL 1 is located between the silicon substrate 21 and the second redistribution layer RDL 2. A dielectric barrier layer 24 is disposed between the first redistribution layer RDL 1 and the second redistribution layer RDL 2, and disposed on a side that is on the second redistribution layer RDL 2 and that is away from the first redistribution layer RDL 1. In FIG. 6, that the part that is of the via 23 and that extends to the silicon substrate 21 does not run through the silicon substrate 21 is used as an example for description. FIG. 6 is a sectional view of the integrated circuit by viewing downward in a direction perpendicular to the straight line HH'.

Further, a metal material is disposed in the via 23, that is, the via 23 is filled with the metal material. The metal routing 221 in the RDL 22 is electrically connected to the metal material disposed in the via 23 on an outer side of the dielectric layer 222. An insulating material may be disposed between an inner wall of the via 23 and the metal material disposed in the via 23. In this case, the metal material in the via 23 and the silicon substrate 21 may be insulated by using the insulating material.

Figure 7:
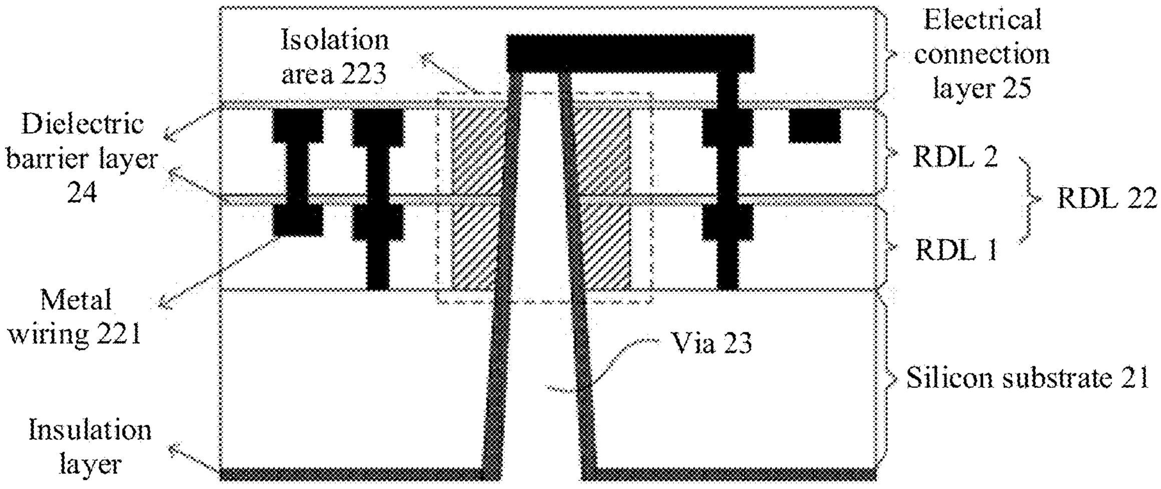
FIG. 7 is a schematic diagram of a structure of a fifth integrated circuit according to an embodiment of this application.

For example, as shown in FIG. 7, the integrated circuit further includes an electrical connection layer 25. The electrical connection layer 25 is located on a side that is on the metal routing 221 and that is away from the silicon substrate 21, and the metal routing 221 in the RDL 22 is electrically connected to the metal material disposed in the via 23 in the electrical connection layer 25. Optionally, the electrical connection layer 25 may be the second material whose porosity is less than the first preset value. Further, when the via 23 runs through the silicon substrate 21, an insulation layer may further be disposed on a side that is of the silicon substrate 21 and that is away from the RDL 22. FIG. 7 is a sectional view of the integrated circuit by viewing downward in a direction perpendicular to the straight line HR.

In this embodiment of this application, the isolation area 223 with the dense material is disposed in the RDL 22, the via 23 is disposed inside the isolation area 223, and the dense material surrounds the via 23. Because the dense material can isolate water vapor, less water vapor in the via 23 may permeate into the dielectric layer 222 and the metal routing 221. Therefore, a series of problems caused by the water vapor permeating into the dielectric layer 222 are resolved, such as a dielectric constant increase, degradation of a time dependent dielectric breakdown (TDDB) characteristic, oxidation of the metal routing, degradation of electromigration resistance, and delamination.

Figure 8:
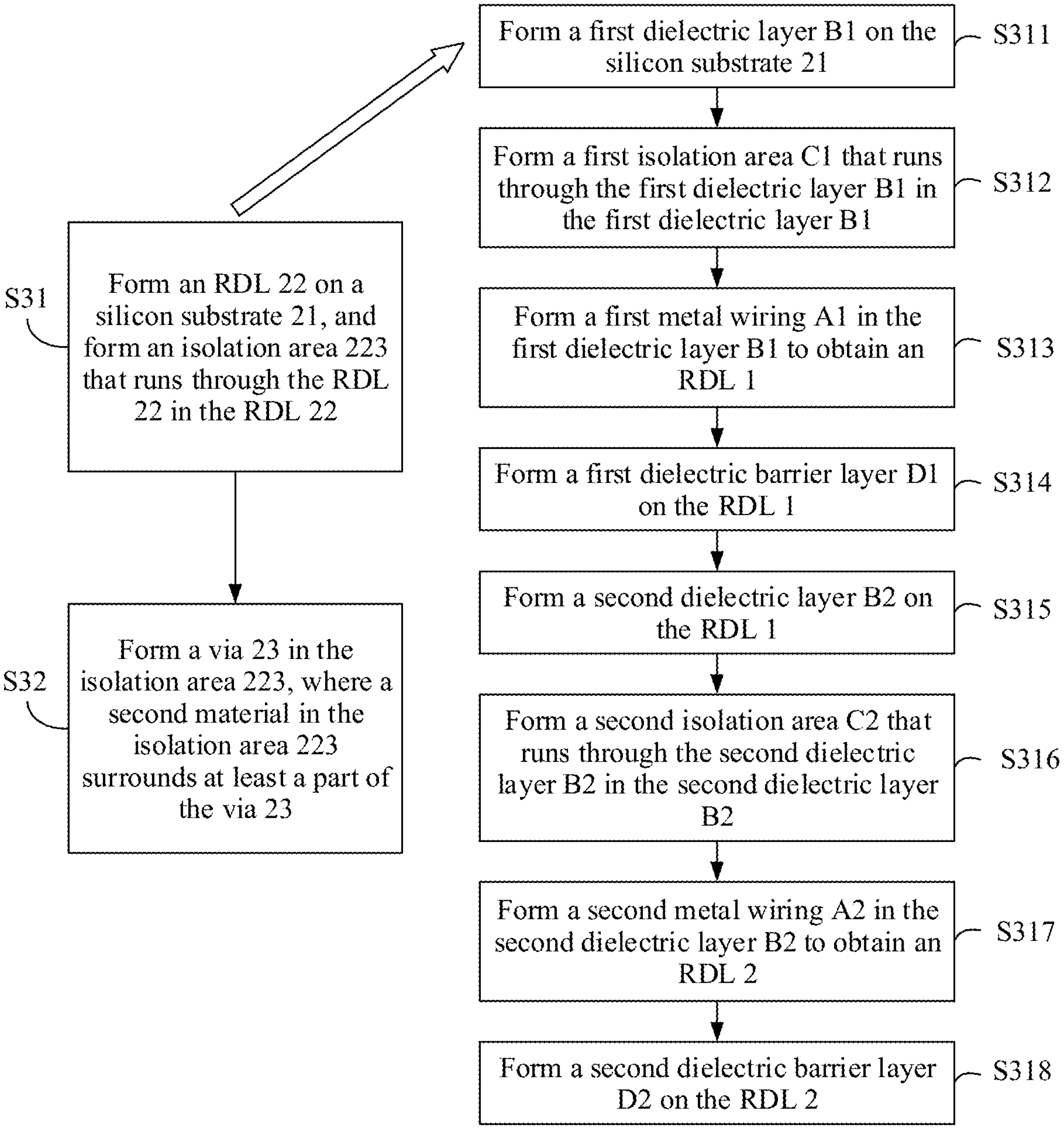
FIG. 8 is a schematic flowchart of a manufacturing method of an integrated circuit according to an embodiment of this application.

FIG. 8 is a schematic flowchart of a manufacturing method of an integrated circuit according to an embodiment of this application. The integrated circuit may be the integrated circuit described in any one of FIG. 3 to FIG. 7. As shown in FIG. 8, the method may include the following steps.

S31: Form an RDL 22 on a silicon substrate 21, and form an isolation area 223 that runs through the RDL 22 in the RDL 22. The RDL 22 includes metal routing 221 and a dielectric layer 222. The dielectric layer 222 is a first material. The isolation area 223 includes a second material. A porosity of the second material is less than a porosity of the first material.

In an embodiment, the porosity of the first material is greater than or equal to a first preset value, and the porosity of the second material is less than the first preset value. The first preset value may be set in advance, for example, the first preset value may be 5% or 6%. The first material may also be referred to as a porous material, and has characteristics of easy water absorption and low dielectric constant. For example, a dielectric constant of the porous material is less than a dielectric constant of silicon dioxide $SiO_2$. The second material may also be referred to as a dense material, and has a characteristic of being not easy to absorb water. Usually, a dielectric constant of the second material is greater than the dielectric constant of the first material.

In addition, the first material includes at least one of the following: porous silicon oxycarbide SiOC, porous methyl silsesquioxane MSQ, porous hydrogen silsesquioxane HSQ, and porous organosilicate glass OSG. Alternatively, the first material in the dielectric layer 222 may be replaced with another non-porous material that has characteristics of easy water absorption and low dielectric constant. For example, the another non-porous material may include fluorosilicate glass (FSG). The second material includes at least one of the following: silicon oxide SiO, silicon nitride SiN, silicon carbide SiC, silicon oxycarbide SiOC, silicon carbonitride SiCN, silicon oxynitride SiON, and silicon carbonitride oxide SiCNO.

It should be noted that all the foregoing related descriptions of the integrated circuit may be referred to the manufacturing method of an integrated circuit. For example, all related descriptions of the RDL 22, the dielectric layer 222, the first preset value, the first material, and the second material may be referred to the manufacturing method of an integrated circuit. Details are not described herein in this embodiment of this application.

Optionally, the RDL 22 may include one or a plurality of layers. When the RDL 22 includes one layer, the RDL 22 may be a first redistribution layer RDL 1. The RDL 1 may include first metal routing A1 and a first dielectric layer B1, and the isolation area 223 may be a first isolation area C1. When the RDL 22 includes a plurality of layers, for example, two layers, the RDL 22 may include a first redistribution layer RDL 1 and a second redistribution layer RDL 2. The RDL 1 may include first metal routing L1 and a first dielectric layer B1. The RDL 2 may include second metal routing A2 and a second dielectric layer B2. The isolation area 223 may include a first isolation area C1 and a second isolation area C2.

Figure 9:
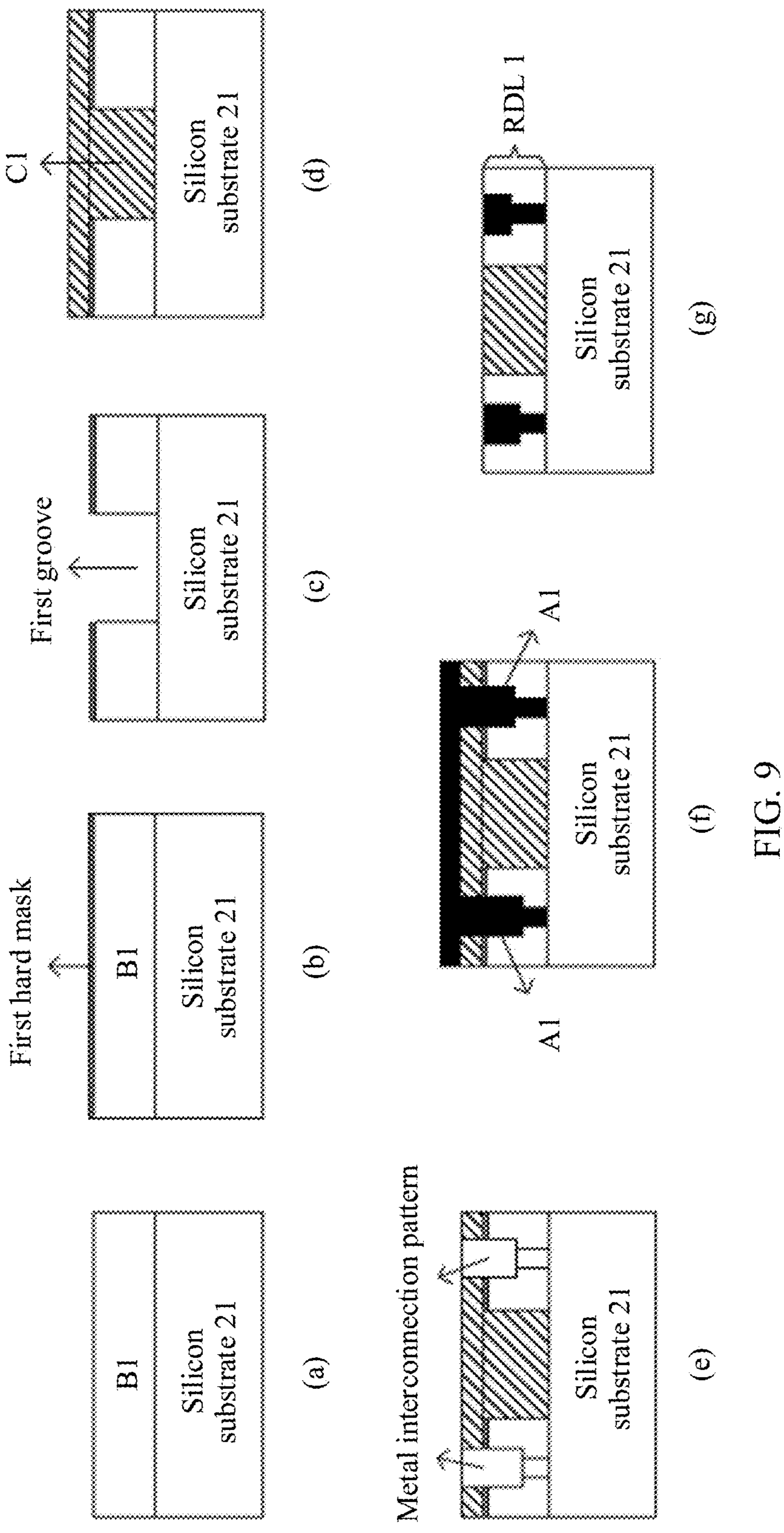
FIG. 9 shows sectional views in a process of manufacturing an integrated circuit according to an embodiment of this application.

Specifically, as shown in FIG. 8, when the RDL 22 includes one layer, the step S31 may specifically include S311 to S313 or S311 to S314. FIG. 9 shows sectional views of the integrated circuit in a process of manufacturing the integrated circuit.

S311: Form the first dielectric layer B1 on the silicon substrate 21, as shown in (a) in FIG. 9.

The first material whose porosity is greater than or equal to the first preset value is formed on a surface of the silicon substrate 21 by using a deposition (for example, chemical vapor deposition) method, to form the first dielectric layer B1. Optionally, the first material (namely, a matrix material) and porogen are deposited on the surface of the silicon substrate 21 by using the chemical vapor deposition method, and then the porogen is removed, for example, the porogen is thermally decomposed at 400° C., to form the first dielectric layer B1 that has uniformly distributed nano-scale pores.

S312: Form the first isolation area C1 that runs through the first dielectric layer B1 in the first dielectric layer B1.

Specifically, a first hard mask is deposited on the first dielectric layer B1, and a first groove that runs through the first dielectric layer B1 is formed in the first dielectric layer B1 by using processes such as photoetching and etching, as shown in (b) and (c) in FIG. 9. Then, the second material (namely, the dense material, for example, SiO, SiN, or SiC) is filled in the first groove, to form the first isolation area C1 that runs through the first dielectric layer B1. Specifically, the second material may be deposited in the first groove by using a deposition (for example, chemical vapor deposition) method, and the filling of the second material is implemented without deposition of a porogen, as shown in (d) in FIG. 9.

The first groove may have a columnar or cylindrical structure. The columnar structure herein may not be limited to a columnar structure whose cross section is circular, but further includes a columnar structure whose cross section is oval, triangular, quadrilateral, pentagonal, hexagonal, or of another shape. The cylindrical structure herein may not be limited to a cylindrical structure whose cross section is of a circular ring shape, but further includes a cylindrical structure whose cross section is of another shape, for example, an elliptical ring, a triangular ring, a quadrilateral ring, a pentagonal ring, or a hexagonal ring. A difference between the first groove with a columnar structure and the first groove with a cylindrical structure is that: When the first groove has a columnar structure, the second material in the isolation area 223 may be in contact with the subsequently formed via 23; and when the first groove has a cylindrical structure, the first material may be disposed between the second material in the isolation area 223 and the subsequently formed via 23, or the second material in the isolation area 223 is in contact with the subsequently formed via 23.

S313: Form the first metal routing A1 in the first dielectric layer B1 to obtain the RDL 1.

Specifically, a groove for metal routing is formed in the first dielectric layer B1 by using photoetching and etching processes. The groove for metal routing may also be referred to as a metal interconnection pattern, as shown in (e) in FIG. 9. A metal material is filled in the groove for metal routing to form the first metal routing A1, as shown in (f) in FIG. 9. Then, planarization is performed. For example, the metal material and the second material that are on a surface that is of the first dielectric layer B1 and that is away from a side of the silicon substrate 21 are removed by using a process, for example, chemical mechanical polishing, so that one side of the first isolation area C1, one side of the first metal routing A1, and one side of the first dielectric layer B1, which are away from the silicon substrate 21, are flush with each other to obtain the RDL 1, as shown in (g) in FIG. 9. The first hard mask is removed in this process.

Optionally, after S313, the method may further include S314: Form a first dielectric barrier layer D1 on the RDL 1. The first dielectric barrier layer D1 may include any one of the following materials: SiCN, SiCNO, SiON, or the like. Specifically, the first dielectric barrier layer D1 may be formed on the RDL 1 by using a deposition method.

Specifically, as shown in FIG. 8, when the RDL 22 includes a plurality of layers, for example, two layers, the step S31 may further include S315 to S317 or S315 to S318.

S315: Form the second dielectric layer B2 on the RDL 1. When the first dielectric barrier layer D1 is formed on the RDL 1, the second dielectric layer B2 is specifically formed on the first dielectric barrier layer D1.

S316: Form the second isolation area C2 that runs through the second dielectric layer B2 in the second dielectric layer B2. Specifically, a second hard mask is deposited on the second dielectric layer B2, and a second groove that runs through the second dielectric layer B2 is formed in the second dielectric layer B2. Projections that are of the first groove and the second groove and that are in a same dielectric layer overlap, and the second hard mask is removed when the second metal routing A2 is subsequently formed. The second material is filled in the second groove to form the second isolation area C2 that runs through the second dielectric layer B2.

S317: Form the second metal routing A2 in the second dielectric layer B2 to obtain the RDL 2. It should be noted that a detailed process of forming the second metal routing A2 in the second dielectric layer B2 is similar to that in S313. For details, refer to related descriptions in S313. Details are not described herein in this embodiment of this application.

Optionally, after S317, the method may further include S318: Form a second dielectric barrier layer D2 on the RDL 2. A detailed process of forming the second dielectric barrier layer D2 is also similar to a detailed process of forming the first dielectric layer D1 in S314. For details, refer to related descriptions in S314. Details are not described herein in this embodiment of this application.

Further, when the RDL 22 includes three or more layers, a manufacturing procedure of each layer of RDL is similar to manufacturing procedures of the RDL 1 and the RDL 2. Details are not described in this embodiment of this application.

S32: Form the via 23 in the isolation area 223, where the second material in the isolation area 223 surrounds at least a part of the via 23.

Figure 10:
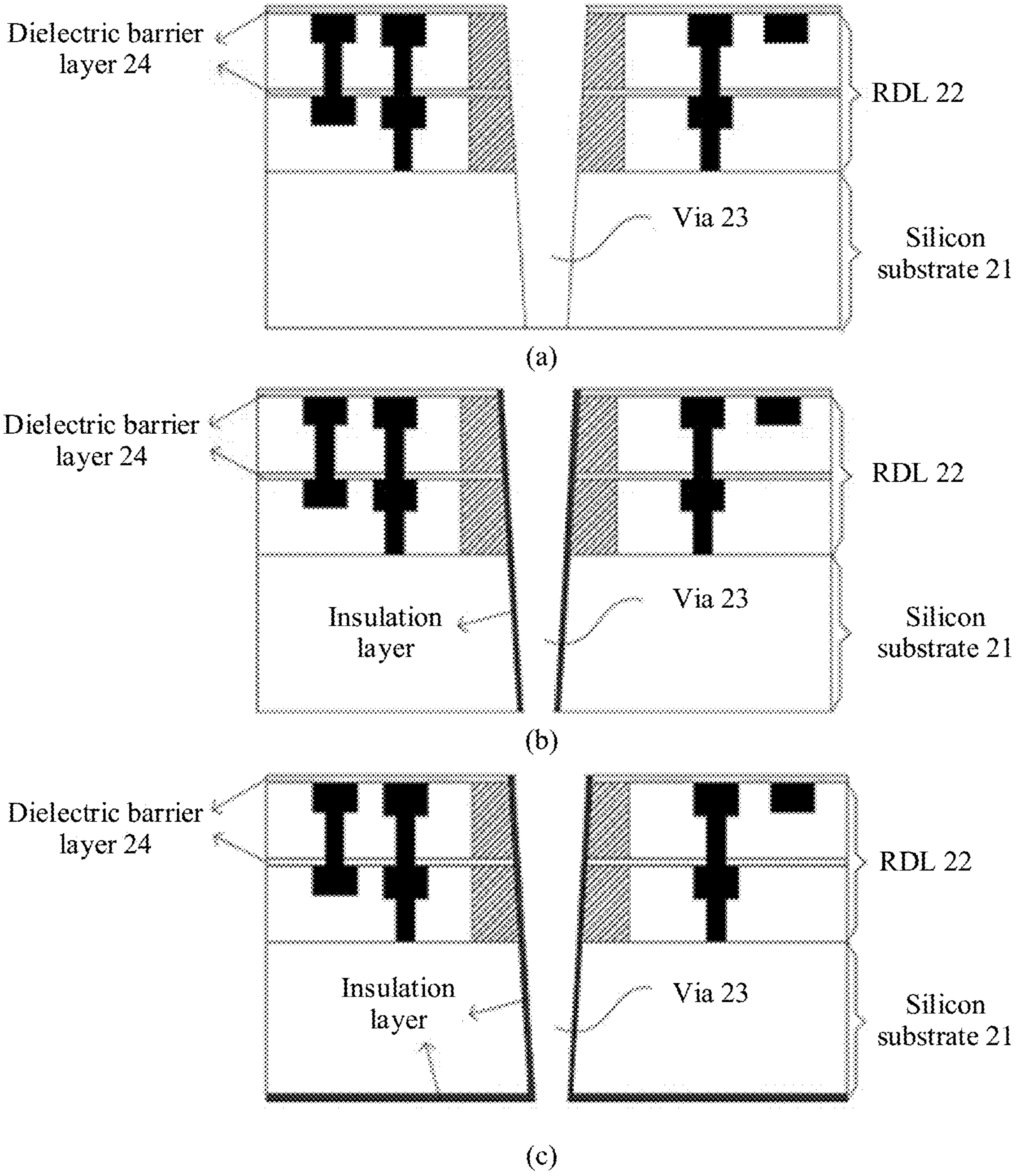
FIG. 10 shows sectional views in another process of manufacturing an integrated circuit according to an embodiment of this application.

Specifically, the via 23 is formed by etching in the isolation area 223 by using processes such as photoetching and etching, as shown in (a) in FIG. 10. Wet cleaning is performed on the via 23. For example, the via 23 is cleaned by using aqueous cleaning fluid, and an insulation layer is deposited on an inner wall of the via 23. For example, silicon oxide is deposited by using a chemical vapor deposition process, as shown in (b) in FIG. 10. A metal material is filled in the via 23, for example, a tantalum/tantalum nitride (chemical formula: Ta/TaN) or titanium/titanium nitride (chemical formula: Ti/TiN) diffusion barrier layer and a copper seed layer are prepared by using physical vapor deposition or atomic layer deposition, and then the via 23 is filled with copper by using an electroplating process. Then, surface chemical mechanical polishing is performed on a side that is of the silicon substrate 21 and that is away from the RDL 22, to, for example, remove excess copper outside the via 23, enable the via 23 to run through the silicon substrate 21, and form an insulation layer on the side that is of the silicon substrate 21 and that is away from the RDL 22, as shown in (c) in FIG. 10. It should be noted that for detailed descriptions of the related steps of forming the via 23, filling the via 23 with a metal material, and performing surface chemical mechanical polishing on the side that is of the silicon substrate 21 and that is away from the RDL 22, refer to descriptions in a related technology. Details are not described herein in this embodiment of this application.

Optionally, when the via 23 is formed in the isolation area 223, the via 23 that runs through the RDL 22, for example, the via 23 shown in FIG. 6, may be formed in the isolation area 223 in a direction from a side that is on the RDL 22 and that is away from the silicon substrate 21 to the silicon substrate 21. Alternatively, when the via 23 is formed in the isolation area 223, the via 23, for example, the via 23 shown in FIG. 7, may be formed in the isolation area 223 in a direction from a side that is on the silicon substrate 21 and that is away from the RDL 22 to the RDL 22.

Further, after the via 23 is formed in the isolation area 223, an electrical connection layer 25 may further be formed on the RDL 22. The electrical connection layer 25 is configured to implement an electrical connection between the metal routing 221 in the RDL 22 and the metal material disposed in the via 23. The electrical connection layer 25 may be the second material whose porosity is less than the first preset value.

In the manufacturing method of an integrated circuit provided in this embodiment of this application, the isolation area 223 with the dense material may be disposed in the RDL 22, the via 23 is disposed inside the isolation area 223, and the dense material surrounds the via 23. Because the dense material can isolate water vapor, water vapor in the via 23 cannot permeate into the dielectric layer 222 and the metal routing 221 through the dense material. Therefore, a series of problems caused by the water vapor permeating into the dielectric layer 222 are resolved, such as a dielectric constant increase, degradation of a time dependent dielectric breakdown characteristic, oxidation of the metal routing, degradation of electromigration resistance, and delamination.

In view of this, an embodiment of this application further provides an electronic device. The electronic device includes a printed circuit board PCB and any integrated circuit provided above. The integrated circuit is fastened to the printed circuit board PCB. The integrated circuit may be an integrated circuit corresponding to a processor or a memory of the electronic device. Optionally, the integrated circuit further includes a package substrate. The package substrate is fastened to the printed circuit board PCB by using a solder ball, and the integrated circuit is fastened to the package substrate by using a solder ball.

The integrated circuit includes a silicon substrate and a redistribution layer RDL located on the silicon substrate. The RDL includes metal routing and a dielectric layer, and the dielectric layer is a first material. An isolation area that runs through the RDL is disposed in the RDL. The isolation area includes a second material. A porosity of the second material is less than a porosity of the first material. For example, the first material is a porous material, and the second material is a dense material. A via is disposed in the isolation area, and the second material surrounds at least a part of the via. Optionally, the electronic device is a terminal device or a base station.

It should be noted that all the related descriptions of the integrated circuit provided above may be referred to the electronic device, and details are not described herein in this embodiment of this application.

According to another aspect of this application, a non-transitory computer-readable storage medium used together with a computer is further provided. The computer has software for creating an integrated circuit. The computer-readable storage medium stores one or more computer-readable data structures, and the one or more computer-readable data structures have photomask data for manufacturing the integrated circuit provided in any diagram provided above.

In conclusion, it should be noted that the foregoing descriptions are merely specific implementations of this application, but are not intended to limit the protection scope of this application. Any variation or replacement within the technical scope disclosed in this application shall fall within the protection scope of this application. Therefore, the protection scope of this application shall be subject to the protection scope of the claims.

What is claimed is:

1. An integrated circuit, comprising:

a silicon substrate;

a redistribution layer located on the silicon substrate;

the redistribution layer comprises:

a first redistribution layer, wherein the first redistribution layer comprises a first metal routing and a first dielectric layer;

a second redistribution layer, wherein the second redistribution layer comprises second metal routing and a second dielectric layer;

an isolation area extending through the redistribution layer;

the isolation area comprises a first isolation area and a second isolation area, wherein the first isolation area extends through the first dielectric layer in the first dielectric layer and the second isolation area extends through the second dielectric layer in the second dielectric layer;

the first redistribution layer comprising the first metal routing in the first dielectric layer;

the second redistribution layer comprising the second metal routing in the second dielectric layer;

wherein the first dielectric layer and the second dielectric layer comprise a first material, and wherein the isolation area comprises a second material, a porosity of the second material is less than a porosity of the first material, wherein a via is disposed within the isolation area, and wherein the second material surrounds at least a part of the via.

2. The integrated circuit of claim 1, wherein the first material is a porous material, and the second material is a dense material.

3. The integrated circuit of claim 1, wherein the porosity of the first material is greater than or equal to a first preset value, and the porosity of the second material is less than the first preset value, wherein the first preset value is 5%.

4. The integrated circuit of claim 1, wherein a dielectric constant of the first material is less than a dielectric constant of silicon dioxide $SiO_2$.

5. The integrated circuit of claim 1, wherein the first material comprises at least one of the following: porous carbon-doped silicon oxide, porous methyl silsesquioxane, porous hydrogen silsesquioxane, or porous organosilicate glass.

6. The integrated circuit of claim 1, wherein the second material comprises at least one of the following: silicon oxide SiO, silicon nitride SiN, silicon carbide SiC, silicon oxycarbide SiOC, silicon carbonitride SiCN, silicon oxynitride SiON, or silicon carbonitride oxide SiCNO.

7. The integrated circuit of claim 1, wherein the redistribution layer comprises:

a first redistribution layer;

a second redistribution layer, wherein the first redistribution layer is located between the silicon substrate and the second redistribution layer; and a first dielectric barrier layer, disposed between the first redistribution layer and the second redistribution layer; and a second dielectric barrier layer, disposed on a side that is on the second redistribution layer and that is away from the first redistribution layer.

8. The integrated circuit of claim 1, wherein the first metal routing in the first redistribution layer is electrically connected to a metal material disposed in the via on an outer side of the first dielectric layer.

9. The integrated circuit of claim 1, wherein the via extends through the isolation area to the silicon substrate along a depth direction of the redistribution layer, and the second material in the isolation area surrounds a part that is of the via and that extends through the isolation area.

10. The integrated circuit of claim 1, wherein the isolation area is cylindrical; and the second material in the isolation area is in contact with the via, or the first material is disposed between the second material and the via in the isolation area.

11. A manufacturing method of an integrated circuit, comprising:

providing a silicon substrate;

forming a redistribution layer on the silicon substrate, wherein the redistribution layer comprises metal routing and a dielectric layer;

forming an isolation area extending through the redistribution layer;

wherein forming the redistribution layer comprises:

forming a first redistribution layer, wherein the first redistribution layer comprises first metal routing and a first dielectric layer;

forming a second redistribution layer, wherein the second redistribution layer comprises second metal routing and a second dielectric layer, and wherein the isolation area comprises a first isolation area and a second isolation area;

the forming a redistribution layer on a silicon substrate, and forming an isolation area extending through the redistribution layer in the redistribution layer comprises:

forming the first dielectric layer on the silicon substrate;

forming the first isolation area that extends through the first dielectric layer in the first dielectric layer;

forming the first metal routing in the first dielectric layer, to obtain the first redistribution layer;

forming the second dielectric layer on the first redistribution layer;

forming the second isolation area that extends through the second dielectric layer in the second dielectric layer; and forming the second metal routing in the second dielectric layer, to obtain the second redistribution layer;

wherein the first dielectric layer and the second dielectric layer comprise a first material, the isolation area comprises a second material, and a porosity of the second material is less than a porosity of the first material; and forming a via in the isolation area, wherein the second material in the isolation area surrounds at least a part of the via.

12. The method of claim 11, wherein the forming the first isolation area that extends through the first dielectric layer in the first dielectric layer comprises:

forming a first groove that extends through the first dielectric layer in the first dielectric layer; and filling the first groove with the second material, to form the first isolation area that extends through the first dielectric layer; and the forming the second isolation area that extends through the second dielectric layer in the second dielectric layer comprises:

forming a second groove that extends through the second dielectric layer in the second dielectric layer, wherein projections that are of the first groove and the second groove and that are in a same dielectric layer overlap; and filling the second groove with the second material, to form the second isolation area that extends through the second dielectric layer.

13. The method of claim 11, wherein before the forming the second dielectric layer on the first redistribution layer, the method further comprises:

forming a first dielectric barrier layer on the first redistribution layer; and after the forming the second metal routing in the second dielectric layer, to obtain the second redistribution layer, the method further comprises:

forming a second dielectric barrier layer on the second redistribution layer.

14. The method of claim 11, wherein the forming a via in the isolation area comprises:

forming the via in the isolation area in a direction from a side that is on the redistribution layer and that is away from the silicon substrate to the silicon substrate.

15. The method of claim 11, wherein the forming a via in the isolation area comprises:

forming the via in the isolation area in a direction from a side that is on the silicon substrate and that is away from the redistribution layer to the redistribution layer.

16. The method of claim 11, wherein the first material is a porous material, and the second material is a dense material.

17. The method of claim 11, wherein the porosity of the first material is greater than or equal to a first preset value, and the porosity of the second material is less than the first preset value, wherein the first preset value is 5%.

18. An electronic device, wherein the electronic device comprises a printed circuit board and an integrated circuit, wherein the integrated circuit is fixed on the printed circuit board, and the integrated circuit comprises:

a silicon substrate;

a redistribution layer located on the silicon substrate;

the redistribution layer comprises:

a first redistribution layer, wherein the first redistribution layer comprises a first metal routing and a first dielectric layer;

a second redistribution layer, wherein the second redistribution layer comprises second metal routing and a second dielectric layer;

an isolation area extending through the redistribution layer;

the isolation area comprises a first isolation area and a second isolation area, wherein the first isolation area extends through the first dielectric layer in the first dielectric layer and the second isolation area extends through the second dielectric layer in the second dielectric layer;

the first redistribution layer comprising the first metal routing in the first dielectric layer;

the second redistribution layer comprising the second metal routing in the second dielectric layer;

wherein the first dielectric layer and the second dielectric layer comprise a first material, and wherein the isolation area comprises a second material, a porosity of the second material is less than a porosity of the first material, wherein a via is disposed within the isolation area, and wherein the second material surrounds at least a part of the via.

19. The device circuit of claim 18, wherein the first material is a porous material, and the second material is a dense material.

* * * * *